(12) United States Patent
Landt et al.

(10) Patent No.: US 9,496,296 B1
(45) Date of Patent: Nov. 15, 2016

(54) OPTICALLY-TUNED ELECTRONIC COMPONENTS

(71) Applicant: Rockwell Collins, Inc., Cedar Rapids, IA (US)

(72) Inventors: Don L. Landt, Palo, IA (US); Bryan S. McCoy, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 410 days.

(21) Appl. No.: 14/136,766

(22) Filed: Dec. 20, 2013

(51) Int. Cl.
| | | |
|---|---|---|
| *G01J 1/42* | (2006.01) | |
| *H01L 27/144* | (2006.01) | |
| *H01L 31/16* | (2006.01) | |
| *H01L 31/167* | (2006.01) | |
| *H01L 27/146* | (2006.01) | |

(52) U.S. Cl.
CPC ..... *H01L 27/1443* (2013.01); *H01L 27/14638* (2013.01); *H01L 31/162* (2013.01); *H01L 31/165* (2013.01); *H01L 31/167* (2013.01)

(58) Field of Classification Search
CPC .............. H01L 27/1443; H01L 27/14638; H01L 31/162; H01L 31/165; H01L 31/167
USPC ........................................ 250/208.2, 208.3
See application file for complete search history.

(56) References Cited

U.S. PATENT DOCUMENTS

| | | | | |
|---|---|---|---|---|
| 4,332,974 A * | 6/1982 | Fraas | ......... | H01L 31/0687 136/249 |
| 5,978,401 A * | 11/1999 | Morgan | ......... | H01S 5/0262 372/50.21 |
| 6,114,697 A * | 9/2000 | Eden | ......... | G01J 5/08 250/332 |
| 6,771,679 B2 * | 8/2004 | Schie | ......... | H01S 5/0683 372/38.01 |
| 7,019,332 B2 * | 3/2006 | Vieira | ......... | H01S 5/0687 257/184 |
| 2003/0160231 A1 * | 8/2003 | Cole | ......... | G01J 3/26 257/22 |
| 2008/0304531 A1 * | 12/2008 | Mansour | ......... | B82Y 20/00 372/50.121 |
| 2011/0235049 A1 * | 9/2011 | Burnett | ......... | G01J 9/04 356/484 |

* cited by examiner

*Primary Examiner* — Georgia Y Epps
*Assistant Examiner* — Kevin Wyatt
(74) *Attorney, Agent, or Firm* — Angel N. Gerdzhikov; Donna P. Suchy; Daniel M. Barbieri

(57) ABSTRACT

The present disclosure is directed to optically-tuned electronic components including one or more layers of photosensitive semiconductive materials. In some embodiments, an optically-tuned electronic component includes a plurality of device layers have different bandgap characteristics. One or more selected layers can be optically activated (i.e. made substantially conductive) by illuminating at least a portion of each selected layer with illumination having a wavelength shorter than or substantially equal to the activation wavelength of each selected layer. Accordingly, various parameters can be tuned or a circuit can be switched between alternative paths by providing one or more selected wavelengths of illumination.

17 Claims, 7 Drawing Sheets

OPTICALLY-TUNED ELECTRONIC COMPONENTS

FIELD OF INVENTION

The present disclosure relates to the field of electronic circuitry and more particularly to optically-tuned electronic components.

BACKGROUND

Radio products increasingly operate over a wider range of frequencies and waveforms, necessitating filters and switching paths that can accommodate wide radio frequency (RF) bands and high power signals without sacrificing performance (i.e. maintaining high rejection and low insertion loss). Many modern radios are further required to operate under harsh environments with high vibrations, extreme temperatures, and the like. Moreover, modern devices are constantly being manufactured on smaller scales, thus creating a need for more robust circuitry, such as tunable filters instead of switchable fixed filter arrangements.

Current methods of handling wide frequency ranges suffer from various disadvantages. For example, switched filter banks can be relatively large, require complex circuitry, and suffer from switching delays. Varactor-tuned filter banks are designed with varactors functioning as variable capacitive elements. These circuits tend to be more robust; however, varactors are sensitive to thermal variations, and as such, they are unable to handle high power signals without significant losses in performance. Fixed center frequency cavity filters, such as combline or evanescent mode filters, have desirable performance characteristics; however, they lack flexibility in center frequency tuning and are typically restricted to factory settings. Given the disadvantages associated with currently employed filter arrangements, there is clearly a need in the art for electronic circuitry and/or components that enable robust filter and switching path configurations without sacrificing flexibility, signal quality, or performance.

SUMMARY

This disclosure is directed to optically-tuned electronic components incorporating one or more layers of photosensitive semiconductive materials. In some embodiments, several layers having different bandgap characteristics are stacked in increasing or decreasing order. For example, a first layer may have a first bandgap where active carrier flow is increased upon flooding with illumination having a wavelength shorter than or substantially equal to a first activation wavelength, a second layer may have a second bandgap sensitive to illumination having a wavelength shorter than or substantially equal to a second (shorter or longer) activation wavelength, and so on. One or more selected layers can be optically activated (i.e. made substantially conductive) by illuminating at least a portion of each selected layer with illumination having a wavelength shorter than or substantially equal to the respective activation wavelength. Accordingly, various characteristics, such as capacitance, inductance, impedance, or conductivity, of an electronic device incorporating stacked photosensitive semiconductive layers may be optically tuned with a great degree of flexibility, especially as the number of layers (and different bandgaps) is increased.

Some embodiments of the disclosure are directed to an electronic assembly including at least a first conductor, a second conductor, and one or more photosensitive semiconductive layers disposed between the first conductor and the second conductor. The effective conductive or dielectric displacement between the first conductor and the second conductor are, therefore, controlled by selectively activating the one or more photosensitive semiconductive layers separating the conductors. In some embodiments, a plurality of photosensitive semiconductive layers disposed between the conductors include at least a first layer having a first bandgap and a second layer having a second bandgap that is different from the first bandgap. Accordingly, the first layer is sensitive to wavelengths of illumination shorter than or substantially equal to a first activation wavelength defined by the first bandgap, and the second layer is sensitive to wavelengths of illumination shorter than or substantially equal to a second activation wavelength defined by the second bandgap. By flooding one or more of the layers with a selected wavelength of illumination, the effective conductive or dielectric displacement between the first conductor and the second conductor can be optically controlled. Hence, the electronic assembly may function as an optically-tuned capacitive element where the number of steps (i.e. possible capacitance values) is associated with the number of layers having different bandgaps disposed between the conductors.

Some embodiments of the disclosure are further directed to circuitry, such as an optically-tuned filter, including at least one optically-tuned capacitive element and one or more resistive elements and/or inductive elements. In some embodiments, a transmission line and or other components surrounding an optically-tuned capacitive element exhibit resistance and/or inductance. As such, usage of the terms "resistive element" and "inductive element" should not be construed as limiting a filter configuration and/or any other circuitry to a RC, LC, and/or RLC circuit. According to various embodiments, an optically-tuned filter further includes at least one illumination source configured to illuminate at least a portion of a first photosensitive semiconductive layer and/or a second photosensitive semiconductive layer of the optically-tuned capacitive element. According to a selected capacitance value or frequency range, the illumination source is configured to provide illumination having a wavelength shorter than or substantially equal to a first activation wavelength of the first layer or illumination having a wavelength shorter than or substantially equal to a second activation wavelength of the second layer.

It is noted that, in many instances of this disclosure, reference is made to a "first" layer and a "second" layer for illustrative purposes. However, the usage of the terms "first" and "second" does not indicate a particular ordering unless otherwise stated. Those skilled in the art will appreciate that the embodiments described herein may include any number of photosensitive semiconductive layers having various bandgap characteristics. Moreover, various characteristics other than capacitance can be optically controlled using a plurality of photosensitive semiconductive layers or junctions.

It is to be understood that both the foregoing general description and the following detailed description are not necessarily restrictive of the disclosure. The accompanying drawings, which are incorporated in and constitute a part of the specification, illustrate embodiments of the disclosure.

BRIEF DESCRIPTION OF THE DRAWINGS

The embodiments of the disclosure may be better understood by those skilled in the art by reference to the accompanying figures in which.

DETAILED DESCRIPTION

Reference will now be made in detail to the embodiments disclosed, which are illustrated in the accompanying drawings. In general, FIGS. 1 through 7 illustrate embodiments of electronic assemblies configured for optical tuning or switching via one or more photosensitive semiconductive layers such as, photosensitive semiconductive compounds formed from Tellurium (Te) and one or more of Mercury (Hg), Cadmium (Cd), and Zinc (Zn) and/or one or more semiconductor materials such as: Gallium Nitride, Aluminum Gallium Nitride, Indium Gallium Nitride, Gallium Arsenide, doped Gallium Arsenide semiconductors with Aluminum, Indium, and Phosphorus, Germanium semiconductors compounds with various dopings, and the like. Those skilled in the art will appreciate the availability of many (e.g. thousands) of suitable compounds or combinations of materials to achieve desired physical properties, such as bandgap, wavelength sensitivity, and/or transmittance characteristics.

According to various embodiments, some of which are described in further detail below, an electronic assembly includes one or more photosensitive semiconductive layers sensitive to wavelengths of illumination shorter than or substantially equal to one or more respective activation wavelengths, where the activation wavelength is associated with the respective bandgap of each layer. One or more selected layers can be optically activated (i.e. made substantially conductive) by illuminating at least a portion of each selected layer with illumination having a wavelength shorter than or substantially equal to the activation wavelength of each selected layer. By selectively activating one or more layers within the electronic assembly, it is possible to control various parameters, such as capacitance, inductance, impedance, or conductivity across a region with a great degree of flexibility, especially as the number of layers (and different bandgaps) is increased.

Figure 1:
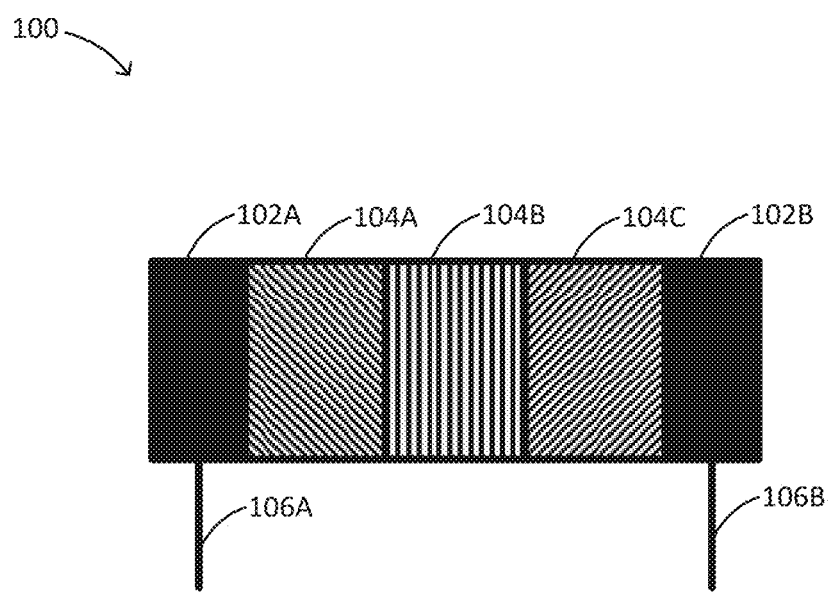
FIG. 1 is a conceptual illustration of an electronic assembly including an optically-tuned electronic component, in accordance with an embodiment of the disclosure.
Figure 2:
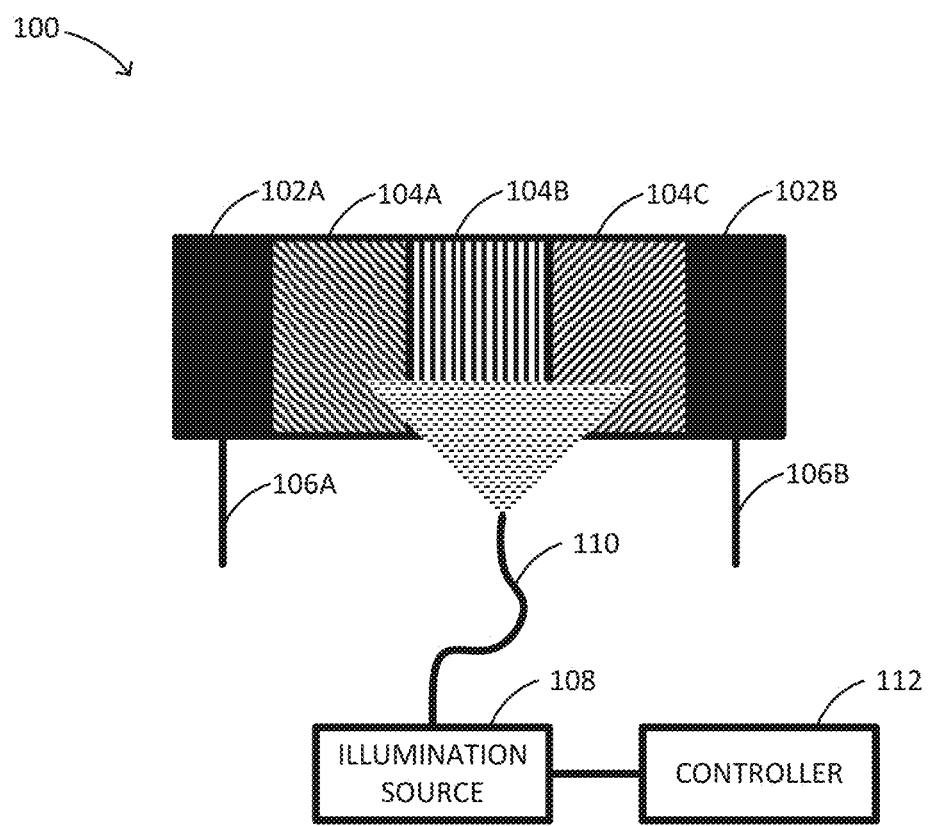
FIG. 2 is a conceptual illustration of the electronic assembly including at least one illumination source for tuning the optically-tuned electronic component, in accordance with an embodiment of the disclosure.

FIG. 1 illustrates an electronic assembly 100 including an electronic component formed by at least a first conductor 102A and a second conductor 102B separated by one or more photosensitive semiconductive layers 104. In an embodiment, the electronic assembly 100 includes at least a first layer 104A and a second layer 104B, where each of the layers 104 has a different bandgap. Accordingly, each of the layers 104 is sensitive to a different range of illumination wavelengths. For example, the first layer 104A may have a first activation wavelength defined by the bandgap of the first layer 104A and the second layer 104B may have a second activation wavelength defined by the bandgap of the second layer 104B. Narrower bandgap materials are typically required for longer activation wavelengths. Accordingly, if the first layer 104A is formed from a narrower bandgap material than the second layer 104B, the first layer 104A may be activated by illumination having a wavelength shorter than or substantially equal to a first activation wavelength. If the first activation wavelength is shorter than a second activation wavelength of the second layer 104B, then illumination having a wavelength shorter than or substantially equal to the second activation wavelength may be suitable for activating both of the first layer 104A and the second layer 104B.

The electronic assembly 100 may include any number of layers 104 having sequentially increasing or decreasing bandgaps, thereby allowing for effective extension of at least a portion of the conductive surface of the first conductor 102A towards the second conductor 102B or vice versa by activating a selected number of layers adjacent to the first conductor 102A or the second conductor 102B. In the embodiment illustrated in FIG. 1, for example, the electronic assembly 100 further includes a third layer 104C. The third layer 104C may have a wider bandgap than the second layer 104B so that illumination having a wavelength shorter than or substantially equal to a third activation wavelength of the third layer 104C is enabled to activate all three layers 104. When the layers 104 are not activated, they exhibit dielectric properties; therefore, applying different wavelengths of illumination to activate selected layers 104 (e.g. only the first layer 104A or only the first layer 104A and the second layer 104B) effectively changes electrical distance or dielectric displacement between the first conductor 102A and the second conductor 102B. Accordingly, the capacitance exhibited between connection terminals 106A and 106B extending, respectively, from the first conductor 102A and the second conductor 102B is optically tuned according to the applied wavelength of illumination.

Although several of the examples herein include a plurality of layers 104 between the first conductor 102A and the second conductor 102B, in some embodiments the electronic assembly 100 may include a single layer 104 between the conductors 102. Accordingly, the electronic assembly 100 may exhibit a single capacitance value when the layer 104 not activated and act as a short circuit when the layer 104 is activated with illumination having a wavelength shorter than or substantially equal to the activation wavelength of the layer 104. In some embodiments, the electronic assembly 100 further includes a non-photosensitive dielectric material disposed between the conductors 102 so that the electronic assembly 100 can be stepped between a first capacitance value based on a dielectric displacement defined by the unactivated layer 104 and the non-photosensitive dielectric material and a second capacitance value based on a dielectric displacement defined by the non-photosensitive dielectric material alone (i.e. when the layer 104 is activated with suitable illumination).

The electronic assembly 100 may include at least one illumination source 108 configured to illuminate one or more of the layers 104 with illumination suitable for activating a selection of the layers 104 (e.g. the first layer 104A, the second layer 104B, and/or the third layer 104C). For example, the illumination source 108 may include a tunable broadband source (e.g. a filtered lamp or laser suspended plasma source) or a plurality of fixed wavelength sources (e.g. light emitting diodes or lasers). The illumination source 108 may be configured to provide illumination having a wavelength shorter than or substantially equal to the first activation wavelength (e.g. within the infrared range), but longer than the second activation wavelength, to activate the first layer 104A without activating the second layer 104B. Similarly, the illumination source 108 may be configured to provide illumination having a wavelength shorter than or substantially equal to the second activation wavelength (e.g. within the visible light range), but longer than the third activation wavelength, to activate the second layer 104B in addition to the first layer 104A without activating the third layer 104C. The illumination source 108 may be further configured to provide illumination having a wavelength shorter than or substantially equal to the third activation wavelength (e.g. within the ultraviolet range) to activate all three of the layers 104A, 104B, and 104C. As previously discussed, the electronic assembly 100 may include any number of layers 104, such as a single layer or a stack of layers with increasing/decreasing bandgaps. Accordingly, those skilled in the art will appreciate that the electronic assembly 100 may include one or more illumination sources 108 configured to provide any range of suitable wavelengths.

Figure 3:
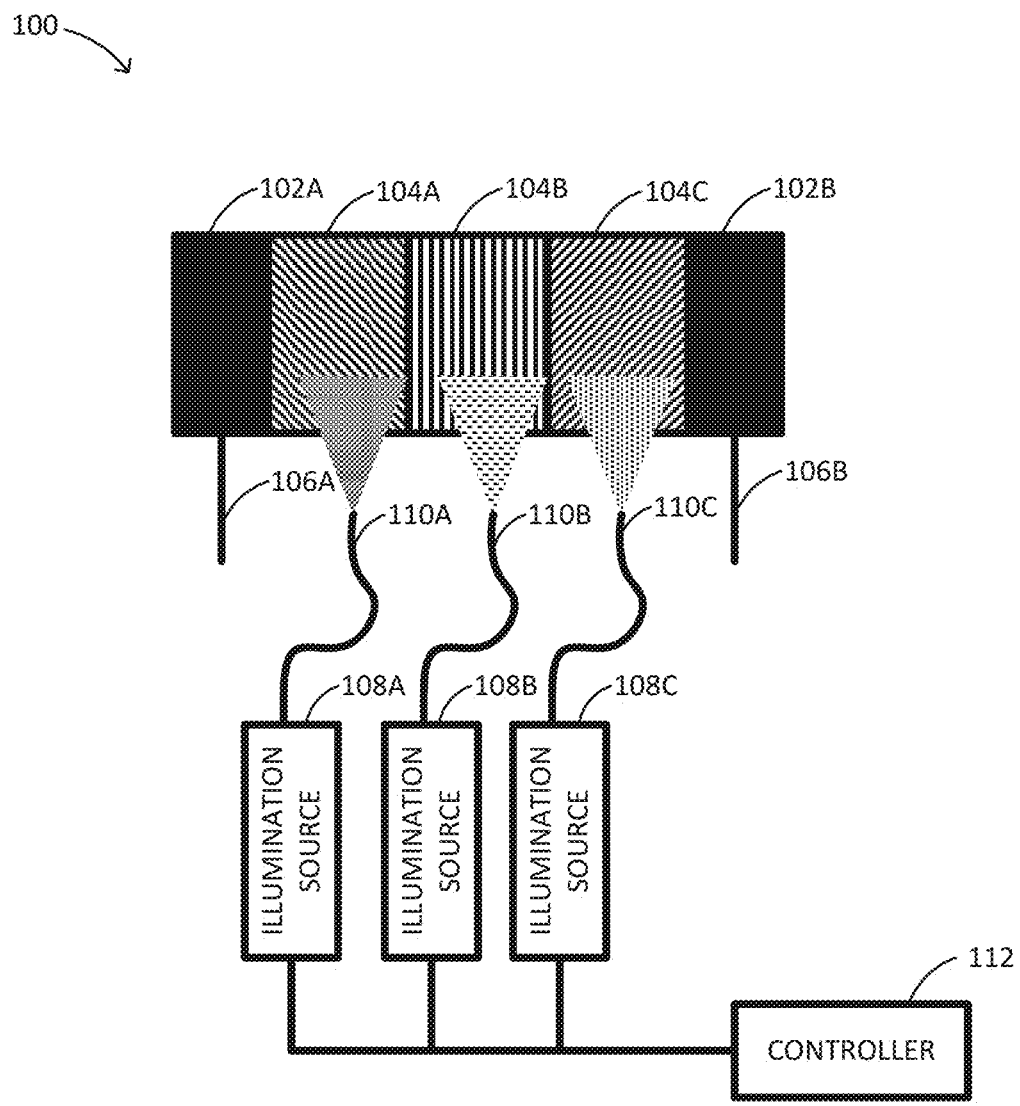
FIG. 3 is a conceptual illustration of the electronic assembly including a plurality of illumination sources for tuning the optically-tuned electronic component, in accordance with an embodiment of the disclosure.

In some embodiments, illumination is delivered from the illumination source 108 to the layers 104 through at least one optical fiber 110 directly or indirectly coupled to the illumination source 108. Additional optics such as lenses, filters, and/or polarization elements may further delineate the optical path between the illumination source 108 and the layers 104. In some embodiments, as shown in FIG. 3, the electronics assembly 100 may include a plurality of illumination sources 108 (e.g. illumination source 108A, illumination source 108B, and illumination source 108C) each being coupled to a respective optical fiber 110 (e.g. optical fiber 110A, optical fiber 110B, and optical fiber 110C) for delivering illumination having a wavelength shorter than or substantially equal to the respective activation wavelength of each layer 104 (e.g. layer 104A, layer 104B, and layer 104C).

The illumination wavelength delivered by the one or more illumination sources 108 may be tuned (i.e. in the case of a filtered or tunable broadband source) or switched (i.e. in the case of fixed sources) via a controller 112 in communication with the one or more illumination sources 108. For example, the controller 112 may be configured to signal the one or more illumination sources 108 to provide illumination suitable for activating one or more selected layers 104 according to a specified parameter (e.g. a selected capacitance value). In some embodiments, the controller 112 includes an analog interface (e.g. one or more switches, knobs, or dials). In some embodiments, the controller 112 may additionally or alternatively include a digital interface (e.g. one or more buttons, touch screen) in communication with a processor configured to transmit an activation signal to the illumination source 108. Accordingly, the electronic assembly 100 may be tuned by controlling the one or more illumination sources 108 according to a user input.

Figure 4:
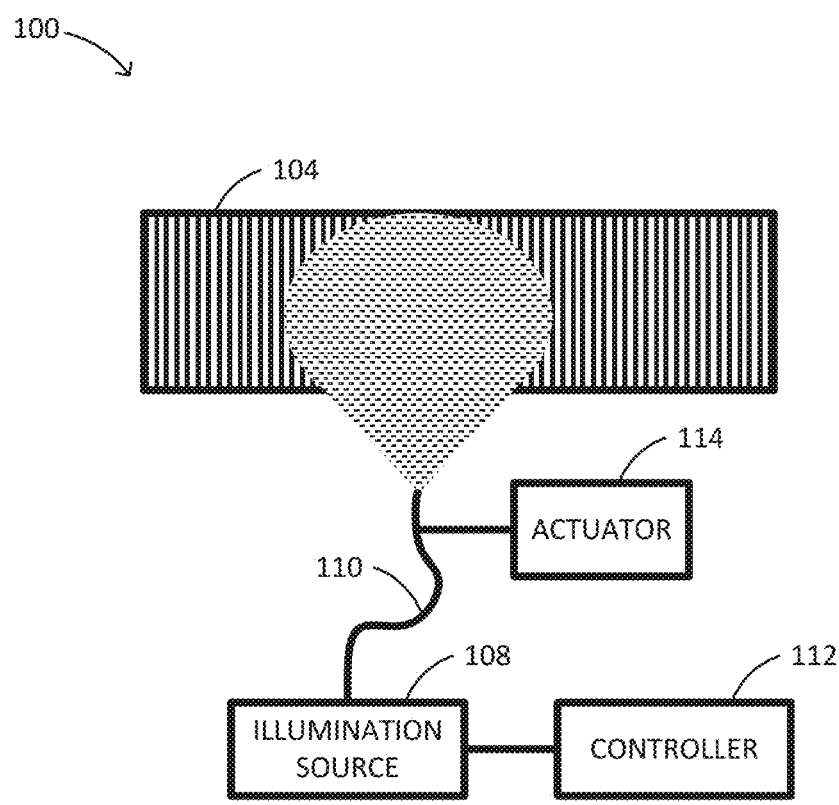
FIG. 4 is a conceptual illustration of the electronic assembly including at least one actuator for controlling an illuminated area of at least one photosensitive semiconductive layer of the optically-tuned electronic component, in accordance with an embodiment of the disclosure.

Conductivity of each layer 104 is a function of the wavelength of illumination impinging upon the layer 104 and the area being illuminated. For example, a selected region of a layer 104 may be flooded with illumination having a wavelength shorter than or substantially equal to the activation wavelength of the layer 104, rather than flooding an entire surface of the layer 104 with illumination. By selectively illuminating only a region of the layer 104, a conductive path flowing through the selected region is defined. This allows for further tuning capabilities—for example, capacitance is both a function of the dielectric displacement between conductive surfaces and the overlapping area of the conductive surfaces. Selecting only a region of a layer 104 effectively alters the overlapping area of the conductive surfaces in addition to effectively changing the dielectric displacement. If a portion of one or more selected layers 104 (e.g. half of the first layer 104A) is activated with suitable illumination, a corresponding portion of the proximate conductor 102 (e.g. half of the first conductor 102A) is effectively extended towards the oppositely disposed conductor 102 (e.g. the second conductor 102B). As such, the illuminated portion of the one or more selected layers 104 redefines the overlapping conductive surface area between the conductors 102 as well as the distance between the conductive surfaces. In some embodiments, as shown in FIG. 4, the electronic assembly 100 further includes an actuator 114 such as a motor or a servo directly or indirectly coupled to the optical fiber 110 or to another optical element (e.g. lens), where the actuator 114 is configured to move the coupled optical fiber 110 or optical element relative to a surface of at least one selected layer 104 to control the illuminated region of the selected layer 104. In some embodiments, the actuator 114 is also driven by the controller 112 according to a user input (e.g. selected capacitance value).

Figure 5A:
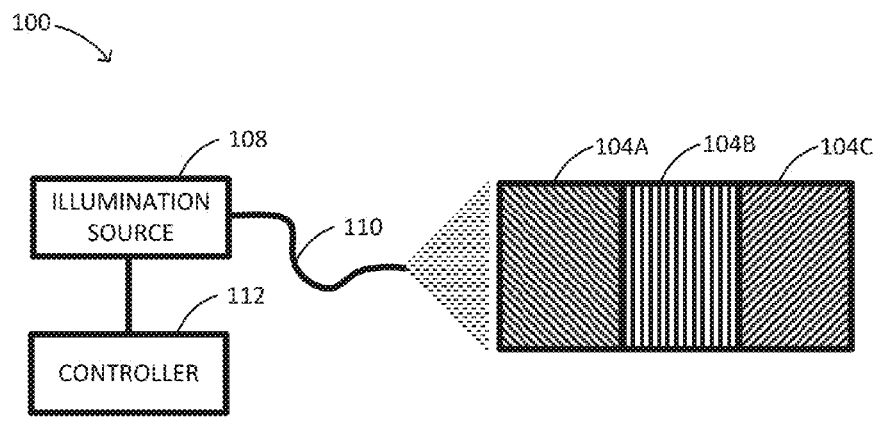
FIG. 5A is a conceptual illustration of the electronic assembly, wherein at least one illumination source is disposed at a first end of a stack of photosensitive semiconductive layers, in accordance with an embodiment of the disclosure.
Figure 5B:
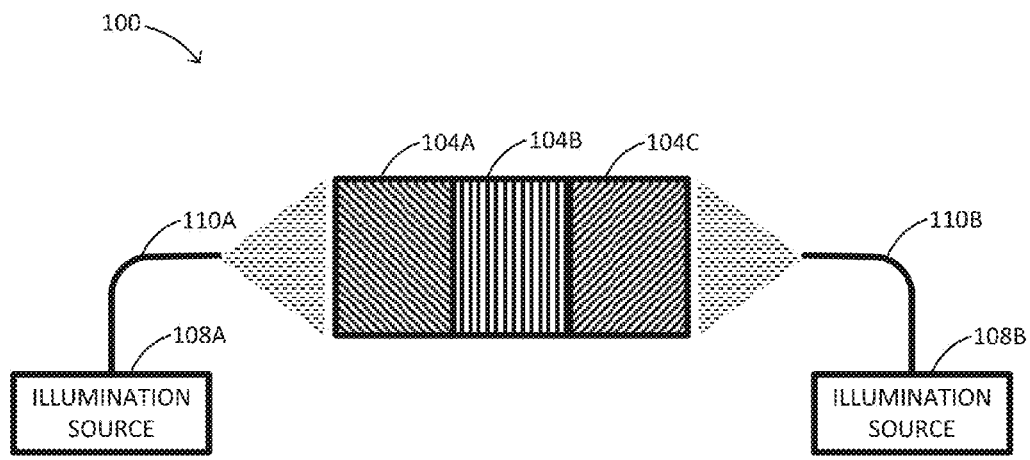
FIG. 5B is a conceptual illustration of the electronic assembly, wherein at least one illumination source is disposed at a first end of a stack of photosensitive semiconductive layers, and wherein at least one illumination source is disposed at a second end of the stack of photosensitive semiconductive layers, in accordance with an embodiment of the disclosure.

As shown in FIGS. 5A and 5B, one or more selected layers 104 of a stack may be activated utilizing illumination provided from one or both ends of the stack. In some embodiments, the layers 104 may be formed from transparent or translucent materials where each of the layers 104 exhibits relatively high transmittance to illumination having a wavelength longer than the respective activation wavelength. For example, a first layer 104A having a first bandgap that is higher than that of a second layer 104B may transmit wavelengths of illumination longer than a first activation wavelength (i.e. illumination with photon energy below the bandgap) of the first layer 104A. If the illumination includes a wavelength shorter than or substantially equal to a second activation wavelength of the second layer 104B, the illumination may be at least partially absorbed by the second layer 104B. In some embodiments, the resulting active (i.e. conductive) region of the second layer 104B may become at least partially opaque and exhibit less transmittance as a result of the active carrier excitation.

In some embodiments (e.g. FIG. 5B), a first illumination source 108A may be configured to deliver illumination via an optical fiber 110A disposed at a first end of the stacked layers 104, and a second illumination source 108B may be configured to deliver illumination via an optical fiber 110B disposed at a second end of the stacked layers 104. By illuminating the layers 104 from both ends, an extended range may be attainable. For example, the layers 104 may be stacked in order of decreasing bandgap from each end to enable activation of a selected depth defined by one or more layers from each end (e.g. activation of layers 104A and 104C only). This allows for even more tuning possibilities. In some embodiments, for example, each of a first stack of layers 104 and a second stack of layers 104 may be arranged with decreasing/increasing bandgaps from an end proximate to a respective illumination source 108 (e.g. sources 108A and 108B). In some embodiments, a non-photosensitive and/or opaque dielectric layer may be disposed between the stacks to avoid illumination bleeding from one end to the other. Each source 108 may be configured to activate a selected number of layers 104 from the respective end of the stack. Accordingly, the dynamic range of an optically-tuned parameter (e.g. capacitance) is effectively doubled because there are twice as many layers 104 that can be optically controlled.

In some embodiments, the electronic assembly 100 effectively functions as an optically-tuned capacitive element. Because the electronic assembly is optically tuned, performance is less likely to be degraded by thermal noise or parasitic capacitances. Flexible circuit arrangements (e.g. parallel or series configurations) are also made possible because the electronic assembly 100 exhibits relatively low noise, even with high power RF signals, as a result of the electronic assembly 100 not requiring complex circuitry (i.e. less conductive surfaces, shorter signal paths) and not being tuned by applying additional voltage or current (i.e. less thermal generation, less offset noise). These characteristics are desirable in many applications, especially in filters operating within RF or IF frequency ranges.

Figure 6:
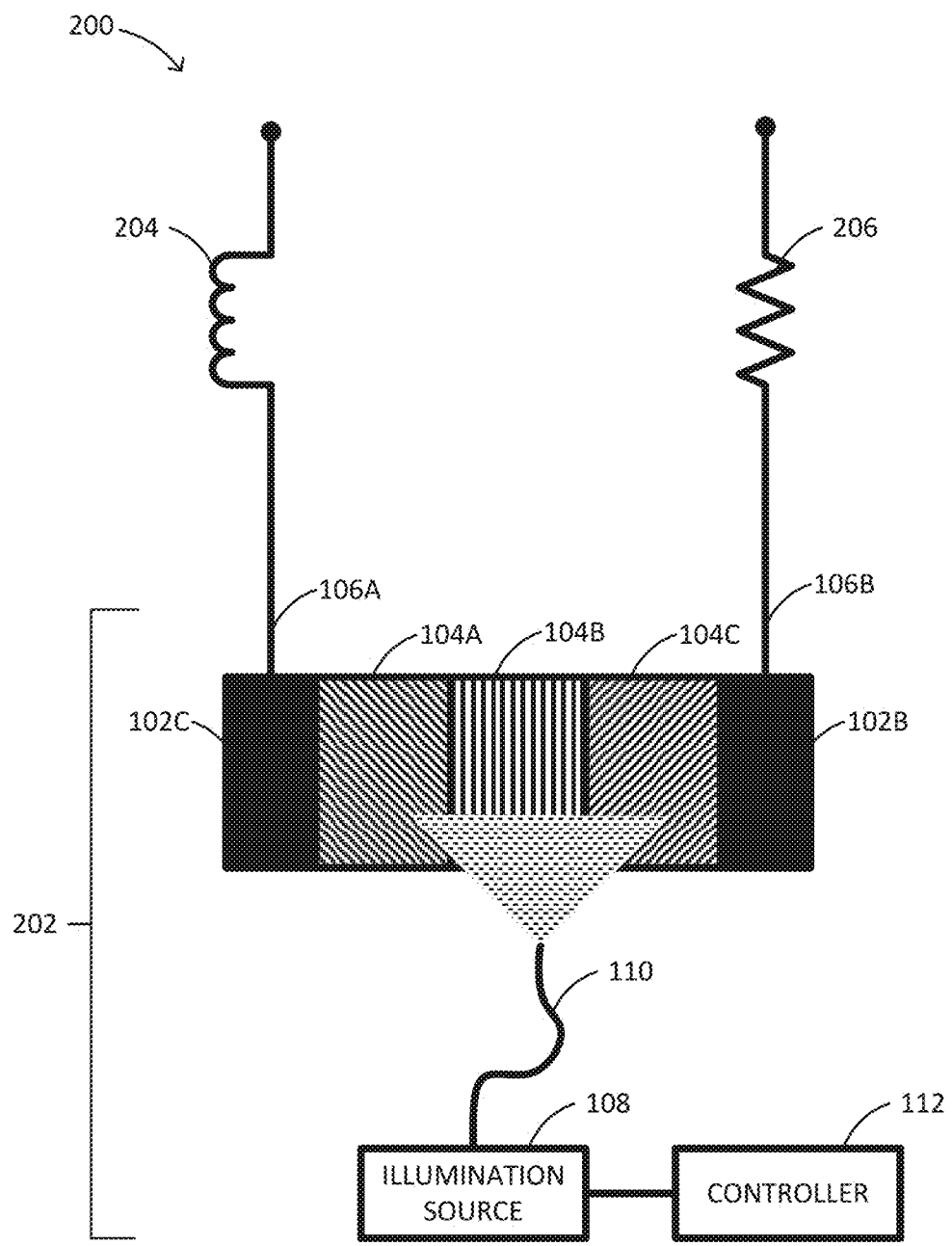
FIG. 6 is a conceptual illustration of a tunable filter including an optically-tuned capacitive element, in accordance with an embodiment of the disclosure.

FIG. 6 is a generalized embodiment of a tunable filter 200 incorporating the electronic assembly 100 in the form of an optically-tuned capacitive element 202. Those skilled in the art will appreciate that one or more optically-tuned capacitive elements 202 may be incorporated into a variety of known filter configurations without departing from the scope of this disclosure. Accordingly, the embodiment illustrated in FIG. 6 is not intended to restrict the disclosure in any way. The tunable filter 200 may include at least one inductive element 204 and/or resistive element 206 in series or in parallel with the capacitive element 202 to form a lowpass filter, bandpass filter, highpass filter, or the like. By optically tuning the capacitive element 202, as described above with regard to the electronic assembly 100, the filter 200 can be tuned to allow or reject specified frequency bands or ranges. To facilitate tuning, in some embodiments, the controller 112 is further configured to signal the one or more illumination sources 108 to illuminate one or more selected layers 104 or a selected region of at least one selected layer 104 of the capacitive element 202 according to a user input associated with a selected cutoff frequency or a selected frequency range.

In some embodiments, several optically-tuned capacitive elements 202 are arranged in series or in parallel. For example, several single-layer and/or multiple-layer capacitive elements 202 of various sizes may be arranged in steps using relays to connect the capacitive elements 202 to the tunable filter 200 or any other reactive system. A reactive system including the one or more optically tuned capacitive elements 202 need not have all elements of an RLC tuned circuit, as illustrated in FIG. 6. Portions of transmission line for example could be considered resistive and/or inductive. Unless otherwise specified, reference to the inductive element 204 or the resistive element 206 should be broadly construed as including portions of a transmission line and/or any surrounding circuitry or components.

Those skilled in the art will further appreciate that the optically-tuned capacitive element 202 can be used as the variable capacitor element anywhere in a circuit. In general, the optically-tuned capacitive element 202 described herein offers many advantages for RF circuits. For instance, no parasitic elements need to be attached directly to the device circuitry for tuning. Other useful features include, but are not limited to, the ability to stand off large voltages and the ability to provide capacitance changes that are nearly immune to influences from RF fields.

The electronic assembly 100 described according to the foregoing embodiments is generally directed to an optically-tuned capacitive element. It is further contemplated that additional electronic components or circuitry may be achieved with similar configurations of conductors and photosensitive semiconductive materials. For example, optically-tuned transistors, resistive elements, inductive elements, and/or optically switched or tuned signal paths may be accomplished by placing graded photosensitive semiconductive layers in stacked arrangements, overlapping arrangements, or at junctions between conductive surfaces or other semiconductive layers.

Figure 7:
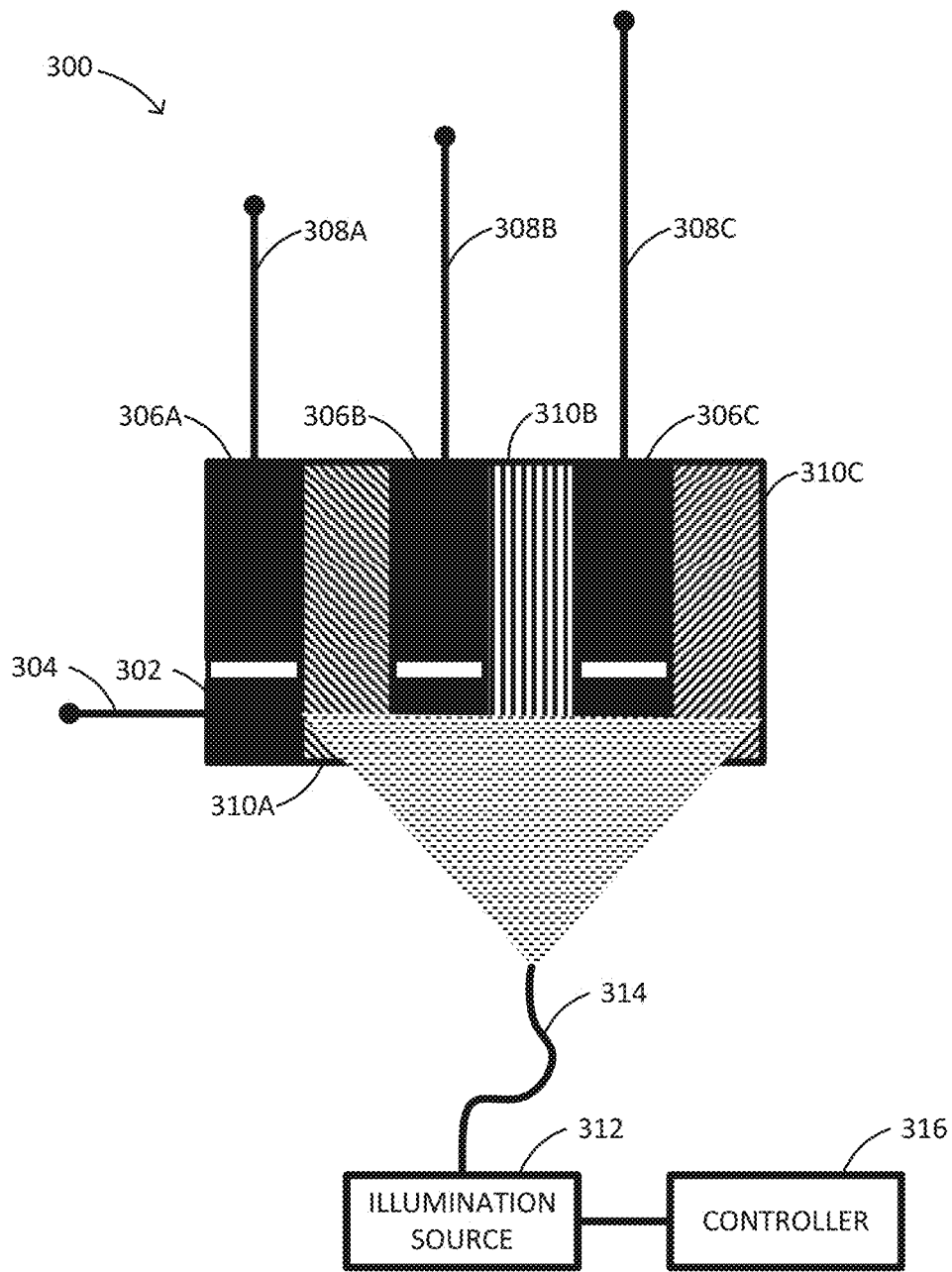
FIG. 7 is a conceptual illustration of an electronic assembly including a plurality of optically-switched conductive paths, in accordance with an embodiment of the disclosure.

FIG. 7 illustrates an exemplary embodiment of an electronic assembly 300 forming optically switched conductive paths. The electronic assembly includes a first conductor 302 having an extended connection terminal 304. The first conductor 302 may be indirectly coupled to any number of secondary conductors 306 (e.g. second conductor 306A, third conductor 306B, and fourth conductor 306C) via respective photosensitive semiconductive layers 310 (e.g. layer 310A, layer 310B, and layer 310C) having different bandgaps. Accordingly, conductive paths between the terminal 304 of the first conductor and respective terminals 308 (e.g. terminal 308A, terminal 308B, and terminal 308C) can be selectively switched on or off by providing illumination suitable for activating one or more selected layers 310 and, hence, establishing a conductive path between the first conductor 302 the one or more conductors 306 corresponding to the one or more selected layers 310.

Similar to electronic assembly 100 described above, the electronic assembly 300 illustrated in FIG. 7 may include one or more illumination sources 312 configured to activate one or more selected layers 310 by providing illumination having a wavelength shorter than or substantially equal to the activation wavelength of each selected layer 310. The electronic assembly 300 may further include at least one optical fiber 314 and/or other optics for delivering illumination from the illumination source 312 to the one or more selected layers 310. In some embodiments, a controller 316 in communication with the one or more illumination sources 312 may be configured to signal the one or more illumination sources 312 to provide illumination suitable for activating one or more selected layers 310 according to a specified signal path. For example, the controller 316 may be configured to turn on selected illumination sources 312 or tune a broadband illumination source 312 to a selected wavelength or range based upon a selection associated with a first path at least partially defined by the second conductor 306A, a selection associated with a second path at least partially defined by the third conductor 306B, or the like.

Using different bandgap materials to enable optical switching allows for control of very tightly fitted (even overlapping) circuitry because the switching is accomplished substantially remotely from the device layers with different wavelengths of illumination. This opens the door to numerous applications, such as optically switched antenna configurations and signal paths within very small electronic devices. It should be clear to those skilled in the art that many variations can be made to the embodiments described herein to achieve electronic circuitry that meets the needs of a specific implementation. As such, the foregoing embodiments should be understood as being conceptually illustrative and not restrictive of the disclosure.

It should be recognized that the various controller functions or operations described throughout the present disclosure may be carried out by any combination of hardware, software, or firmware. In some embodiments, the various controller functions or operations are carried out by one or more of the following: electronic circuits, logic gates, multiplexers, microcontrollers, analog/digital switches, field programmable gate arrays, or computing systems. A computing system may include, but is not limited to, a personal computing system, mainframe computing system, workstation, image computer, parallel processor, or any other device known in the art. In general, the term "computing system" is broadly defined to encompass any device having one or more processors, which execute instructions from a memory medium.

Program instructions implementing methods, such as those manifested by embodiments described herein, may be transmitted over or stored on carrier medium. The carrier medium may be a transmission medium, such as, but not limited to, a wire, cable, or wireless transmission link. The carrier medium may also include a storage medium such as, but not limited to, a read-only memory, a random access memory, a magnetic or optical disk, or a magnetic tape.

It is further contemplated that any embodiment of the disclosure manifested above as a system or method may include at least a portion of any other embodiment described herein. Those having skill in the art will appreciate that there are various embodiments by which systems and methods described herein can be effected, and that the implementation will vary with the context in which an embodiment of the disclosure is deployed.

Furthermore, it is to be understood that the invention is defined by the appended claims. Although embodiments of this invention have been illustrated, it is apparent that various modifications may be made by those skilled in the art without departing from the scope and spirit of the disclosure.

What is claimed is:

1. An electronic assembly, comprising:
   a first conductor;
   a second conductor;
   a plurality of photosensitive semiconductive layers disposed between the first conductor and the second conductor, the plurality of photosensitive semiconductive layers including at least a first layer having a first bandgap and a second layer having a second bandgap that is different from the first bandgap, the first layer being sensitive to wavelengths of illumination shorter than or substantially equal to a first activation wavelength defined by the first bandgap, and the second layer being sensitive to wavelengths of illumination shorter than or substantially equal to a second activation wavelength defined by the second bandgap; and
   an illumination source configured to illuminate at least a portion of at least one of the first layer and the second layer with illumination having a wavelength shorter than or substantially equal to the first activation wavelength or illumination having a wavelength shorter than or substantially equal to the second activation wavelength, the illumination source including:
   a first illumination source configured to provide the illumination having the wavelength shorter than or substantially equal to the first activation wavelength; and
   a second illumination source configured to provide the illumination having the wavelength shorter than or substantially equal to the second activation wavelength.

2. The electronic assembly of claim 1, wherein the first bandgap is narrower than the second bandgap, and wherein the first activation wavelength is longer than the second activation wavelength.

3. The electronic assembly of claim 1, further comprising:
   a controller in communication with the illumination source, the controller being configured to signal the illumination source to provide the illumination having the wavelength shorter than or substantially equal to the first activation wavelength or the illumination having the wavelength shorter than or substantially equal to the second activation wavelength.

4. The electronic assembly of claim 3, wherein the controller is configured to signal the illumination source to provide the illumination having the wavelength shorter than or substantially equal to the first activation wavelength or the illumination having the wavelength shorter than or substantially equal to the second activation wavelength based upon a selected capacitance value.

5. The electronic assembly of claim 4, wherein the controller is further configured to signal the illumination source to illuminate a selected portion of the at least one of the first layer and the second layer based upon the selected capacitance value.

6. The electronic assembly of claim 1, wherein the illumination source comprises:
   a tunable broadband illumination source configured to provide the illumination having the wavelength shorter than or substantially equal to the first activation wavelength, and further configured to provide the illumination having the wavelength shorter than or substantially equal to the second activation wavelength.

7. The electronic assembly of claim 1, further comprising:
   an optical fiber configured to deliver illumination from the illumination source to the at least one of the first layer and the second layer.

8. The electronic assembly of claim 7, further comprising:
   an actuator coupled to the optical fiber, the actuator being configured to actuate the optical fiber to deliver illumination from the illumination source to a selected portion of the at least one of the first layer and the second layer.

9. A tunable filter, comprising:
   at least one of a resistive element and an inductive element;
   at least one capacitive element including a plurality of photosensitive semiconductive layers disposed between a first conductor and a second conductor, the plurality of photosensitive semiconductive layers including at least a first layer having a first bandgap and a second layer having a second bandgap that is different from the first bandgap, the first layer being sensitive to wavelengths of illumination shorter than or substantially equal to a first activation wavelength defined by the first bandgap, and the second layer being sensitive to wavelengths of illumination shorter than or substantially equal to a second activation wavelength defined by the second bandgap; and an illumination source configured to illuminate at least a portion of at least one of the first layer and the second layer with illumination having a wavelength shorter than or substantially equal to the first activation wavelength or illumination having a wavelength shorter than or substantially equal to the second activation wavelength, the illumination source including:
  a first illumination source configured to provide the illumination having the wavelength shorter than or substantially equal to the first activation wavelength; and
  a second illumination source configured to provide the illumination having the wavelength shorter than or substantially equal to the second activation wavelength.

10. The tunable filter of claim 9, further comprising:
a first terminal configured to directly or indirectly couple the at least one capacitive element to at least one radiating element of an electronically scanned array; and
a second terminal configured to directly or indirectly couple the at least one capacitive element to at least one of a processor or an electronic circuit configured to demodulate a signal received from the at least one radiating element of the electronically scanned array.

11. The tunable filter of claim 9, further comprising:
a controller in communication with the illumination source, the controller being configured to signal the illumination source to provide the illumination having the wavelength shorter than or substantially equal to the first activation wavelength or the illumination having the wavelength shorter than or substantially equal to the second activation wavelength.

12. The tunable filter of claim 11, wherein the controller is configured to signal the illumination source to provide the illumination having the wavelength shorter than or substantially equal to the first activation wavelength or the illumination having the wavelength shorter than or substantially equal to the second activation wavelength based upon a selected cutoff frequency or a selected range of frequencies.

13. The tunable filter of claim 12, wherein the controller is further configured to signal the illumination source to illuminate a selected portion of the at least one of the first layer and the second layer based upon the selected cutoff frequency or the selected range of frequencies.

14. The tunable filter of claim 9, further comprising:
an optical fiber configured to deliver illumination from the illumination source to the at least one of the first layer and the second layer.

15. The tunable filter of claim 14, further comprising:
an actuator coupled to the optical fiber, the actuator being configured to actuate the optical fiber to deliver illumination from the illumination source to a selected portion of the at least one of the first layer and the second layer.

16. An electronic assembly, comprising:
a first conductor;
a second conductor;
a third conductor;
a plurality of photosensitive semiconductive layers including at least a first layer disposed between the first conductor and the second conductor having a first bandgap and a second layer disposed between the first conductor and the third conductor having a second bandgap that is different from the first bandgap, the first layer being sensitive to wavelengths of illumination shorter than or substantially equal to a first activation wavelength defined by the first bandgap, and the second layer being sensitive to wavelengths of illumination shorter than or substantially equal to a second activation wavelength defined by the second bandgap; and
an illumination source including:
  a first illumination source configured to provide the illumination having the wavelength shorter than or substantially equal to the first activation wavelength; and
  a second illumination source configured to provide the illumination having the wavelength shorter than or substantially equal to the second activation wavelength.

17. The electronic assembly of claim 16, further comprising:
a controller in communication with the illumination source, the controller being configured to signal the illumination source to provide the illumination having the wavelength shorter than or substantially equal to the first activation wavelength or the illumination having the wavelength shorter than or substantially equal to the second activation wavelength based upon a selection associated with a first path at least partially defined by the second conductor or a selection associated with a second path at least partially defined by the third conductor.

* * * * *